United States Patent [19]
O'Brien et al.

[11] Patent Number: 4,929,946
[45] Date of Patent: May 29, 1990

[54] ADAPTIVE DATA COMPRESSION APPARATUS INCLUDING RUN LENGTH ENCODING FOR A TAPE DRIVE SYSTEM

[75] Inventors: John T. O'Brien, Lafayette; Neil L. Thomas, Boulder; Tracy D. Dyer, Aurora, all of Colo.

[73] Assignee: Storage Technology Corporation, Louisville, Colo.

[21] Appl. No.: 308,767

[22] Filed: Feb. 9, 1989

[51] Int. Cl.$^5$ ............................................. H03M 7/48
[52] U.S. Cl. .................................... 341/87; 341/95; 341/51
[58] Field of Search .................. 341/51, 59, 60, 81, 341/82, 87, 95, 106; 358/261.1

[56] References Cited

U.S. PATENT DOCUMENTS

| | | | |
|---|---|---|---|
| 4,021,782 | 5/1977 | Hoerning | 341/51 |
| 4,494,150 | 1/1985 | Brickman et al. | 358/261.1 |
| 4,558,302 | 12/1985 | Welch | 341/95 |
| 4,568,983 | 2/1986 | Bobick | 358/409 |
| 4,586,027 | 4/1986 | Tsukiyama et al. | 341/95 |
| 4,626,824 | 12/1986 | Larson | 341/95 |
| 4,626,829 | 12/1986 | Hauck | 341/63 |
| 4,729,020 | 3/1988 | Schaphorst et al. | 358/133 |

OTHER PUBLICATIONS

Sellers et al., Error Detecting Logic for Digital Computers, 1968, McGraw-Hill, p. 209.

Primary Examiner—William M. Shoop, Jr.
Assistant Examiner—H. L. Williams
Attorney, Agent, or Firm—Dorr, Carson, Sloan & Peterson

[57] ABSTRACT

The adaptive data compression apparatus is located within a tape drive control unit which is interposed between one or more host computers and one or more tape transports. The adaptive data compression apparatus functions to efficiently compress a user data file received from a host computer into a bit oriented compressed format for storage on the magnetic tape that is loaded in the tape transport. The data compression apparatus divides each block of an incoming user data file into predetermined sized segments, each of which is compressed independently without reference to any other segment in the user data file. The data compression apparatus concurrently uses a plurality of data compression algorithms to adapt the data compression operation to the particular data stored in the user data file. A cyclic redundancy check circuit is used to compute a predetermined length CRC code from all of the incoming user data bytes before they are compressed. The computed CRC code is appended to the end of the compressed data block.

The data compression apparatus operates by converting bytes and strings of bytes into shorter bit string codes called reference values. The reference values replace the bytes and strings of bytes when recorded on the magnetic tape. The byte strings have two forms, a run length form for characters that are repeated three or more times, and a string form that recognizes character patterns of two or more characters.

17 Claims, 6 Drawing Sheets

ADAPTIVE DATA COMPRESSION APPARATUS INCLUDING RUN LENGTH ENCODING FOR A TAPE DRIVE SYSTEM

FIELD OF THE INVENTION

This invention relates to magnetic tape drive systems and, in particular, to an adaptive data compression apparatus that is located within a tape drive control unit which is interposed between one or more host computers and one or more tape transports for compressing/decompressing data transmitted therebetween.

PROBLEM

It is a problem in the field of magnetic tape transports to efficiently compress the data stored therein. Various methods of compressing data have been developed over the past few years. Because of the increased use of computer systems, requirements for storage of data has consistently increased. Consequently, it is desireable to compress data for the purpose of speeding both transmission and storage of the data. Additionally, data compression reduces the physical space required to store data.

Included in the prior art data compression apparatus is one disclosed in U.S. Pat. No. 4,626,829 issued Dec. 2, 1986 to Edward L. Hauck. The Hauck patent discloses and claims a system for compressing data that includes a run length encoder for encoding alphanumeric signals to produce run length encoded data. This run length encoded data has a character byte indicating a repeated character, a flag byte indicating the existence of a run and a run length byte indicating the number of the repeated characters. This system also includes a statistical encoder for statistically encoding the run length encoded data in accordance with one of several statistical encoding tables selected by a pointer signal produced during statistical encoding of previous run length encoded data, and for generating a pointer signal to select a statistical encoding table for subsequent run length encoded data.

U.S. Pat. No. 4,568,983 issued Feb. 4, 1986 to Thomas W. Bobick discloses and claims an image data compression/decompression apparatus. This system assembles scanned image data to represent scanned strips of a document with each strip comprising a plurality of scanned lines. The scanned lines of each strip are read in parallel to form data words to form columns of scanned strips. The data words are encoded by means of Huffman and run length encoding to generate fixed length code words which are concatenated to represent the document. Each strip of code words is reviewed and uncoded data is substituted for coded data in the event the byte length of the coded data exceeds the byte length of the uncoded data. Textual data and continuous tone data are encoded using different encoding techniques due to the varying characteristics. The utilization of fixed length code words, the forced definition of at least the first and last data word of each strip as text and synchronization code words included in the data permit bidirectional encoding/decoding of data blocks.

U.S. Pat. No. 4,729,020 issued Mar. 1, 1988 to R. A. Schaphorst et al. discloses and claims a system for formatting digital signals to be transmitted. This system accepts analog signals and converts them into digital signals which are then compressed into a three bit code. Thereafter the once compressed signals are further compressed in accordance with the variable length code. The twice compressed digital signals are transmitted through formatter circuitry and a tag is added to indicate what forms of compression have been employed on the digital signals. A buffer is also used to maintain a relatively constant supply of data signals for a transmitter.

The difficulty with these arrangements is that each data compression algorithm is optimized for a particular data configuration and therefore has a practical limit in data compression speed and efficiency. The use of fixed length data compression codes and the use of a single algorithm in these above-listed data compression arrangements limits the capability of these existing data compression arrangements since they are not adaptable for various types of data. In the field of magnetic tape drive systems, a small improvement in data compression efficiency or speed results in a significant benefit to the user.

There are four basic types of data redundancy. The first type of data redundancy is character distribution wherein a typical character string some characters are used more frequently than others. A second type is character repetition wherein a string of repetitions of a single character occurs. In this case, the message can usually be encoded more compactly than by just repeating the character symbol. A third type of data redundancy is high usage patterns wherein certain sequences of characters appear with relatively high frequency. These sequences of characters can be represented with relatively fewer bits for a net saving in both time and space. The fourth type of data redundancy is positional redundancy wherein certain characters appear consistently at a predictable place in each block of data.

These types of data redundancy enable data compression algorithms to reduce the size of the data file for data storage purposes One type of data compression is Huffman coding which translates fixedsize pieces of input data into variable length symbols. In normal use, the size of the input symbols is limited by the size of the translation table needed for compression. A table is needed that lists each input symbol and its corresponding code. This single character Huffman coding can cope with character distribution redundancy, not the other types of data redundancy. In addition, the decoding process is complex since the length of each code to be interpreted for decompression purposes is not known until the first few bits are interpreted. Another type of data compression is run-length encoding wherein sequences of identical characters can be encoded as a count field plus an identifier of the repeated character. This approach is effective in graphical images and some data but not in text files. A third type of data compression is programmed compression which uses a standard fixed code table. A disadvantage of this arrangement is that for each type of data file, a code table must be programmed to obtain maximum efficiency, there is no adaptability. A final form of data compression is adaptive compression that converts variable length strings of input symbols into fixed-length codes. The symbol strings are selected so that all have almost equal probability of occurrence. This form of compression is effective at exploiting character frequency and repetition redundancy as well as high-usage pattern redundancy.

SOLUTION

The above described problems are solved and a technical advance achieved in the field by the adaptive data compression apparatus for a magnetic tape drive system that efficiently compresses the blocks of a user data file into a bit oriented compressed format for storage on a magnetic tape data storage medium. The data compression apparatus obtains greater speed and efficiency by dividing each block of an incoming user data file into predetermined sized segments, each of which is compressed independently without reference to any other segment in the user data file. The data compression apparatus concurrently uses a plurality of data compression algorithms to adapt the data compression operation to the particular data stored in the user data file. A cyclic redundancy check circuit is used to compute a predetermined length CRC code from all of the incoming user data bytes before they are compressed The computed CRC code is appended to the end of the compressed data block.

The data compression apparatus operates by converting both bytes and strings of bytes into shorter bit string codes called reference values. The reference values replace the bytes and strings of bytes when recorded on the magnetic tape. The byte strings have two forms, a run length form for characters that are repeated three or more times, and a string form that recognizes character patterns of two or more characters. Two variables are used to indicate the maximum and minimum byte values in a particular segment. Single user data bytes are compressed by using reference values that are defined for the range of values delimited by the above mentioned variables for each segment. One variable called BEGIN contains the smallest user data byte value in the segment while the other variable END contains the largest user data byte value in the segment. Consecutive reference values are assigned to all byte values in the range starting with the byte value in the BEGIN variable through the byte value in the END variable The reference value uses the minimum number of bits necessary to ensure a unique value is assigned to each byte.

Strings of bytes are compressed by assigning a reference value to each defined string using an adaptive data compression algorithm. Subsequent occurrences of that string are replaced by its reference value. Strings are constructed a character at a time, where a previously defined string plus the next user data byte defines a new string and is assigned the next previously undefined reference value. Thus, strings become longer and data compression more efficient as more user data bytes in the segment are examined. String definition occurs by combining the last used reference value with the next user data byte from the input data stream, then searching to see if this string has been previously defined as a string If it has, the next byte is concatenated to this new byte string reference value and a search is again conducted to see if this extended byte string has been previously defined as a string. This sequence is continued until a string is located that has not been previously defined. The last used defined reference value is put in the compressed output data stream and the next consecutive unused reference value is assigned to define the last string that was not found. The search procedure is initiated over again starting with the most recently used user data byte.

Runs of three or more repeated bytes are encoded using a predetermined set of reserved reference values to indicate that the preceding character was repeated the number of times specified by the repeat code. The immediately preceding character is not reincluded in the repeat count. Run length encoding takes precedence over string data compression. Run length encoding, single byte compression, and string data compression are intermixed in any compressed segment within the compressed user data file.

In addition apparatus is included to decompress a compressed segment that is read backwards. Tape drive systems can read files backwards and the present apparatus includes a read backwards buffer and control circuitry to reverse the order of the read backwards segment for decompression purposes. Included in this circuit is apparatus to identify the length of each segment so that the beginning of each segment can be located for decompressing on a segment by segment basis. The decompressed segment is then again reversed for transmission to the control unit host interface. Thus, this apparatus functions bidirectionally.

If the size of a compressed segment in bytes is larger than its size before compression then the segment is not compressed and is recorded in uncompressed format. An uncompressed segment is identified by the BEGIN variable containing a value which is larger than the END variable. Thus, the adaptive data compression apparatus concurrently provides a plurality of data compression operations to optimize the compression of the particular data byte or string of data bytes presently received from a host computer.

DETAILED DESCRIPTION

Figure 1:
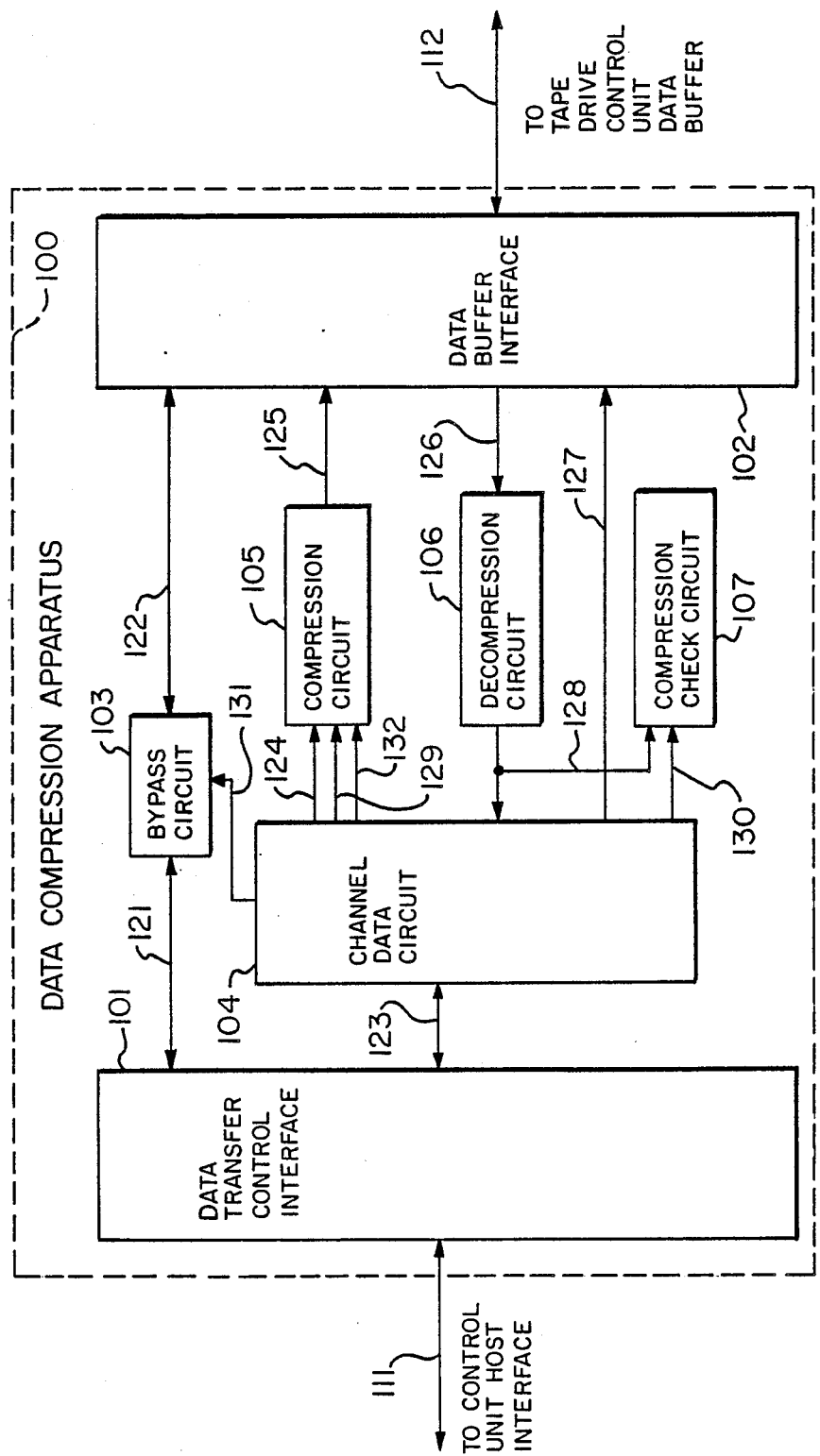
FIG. 1 illustrates the data compression apparatus in block diagram form.

The adaptive data compression apparatus is located within a tape drive control unit which is interposed between one or more host computers and one or more tape transports. The adaptive data compression apparatus functions to efficiently compress the blocks of a user data file received from the host computer into a bit oriented compressed format for storage on the magnetic tape that is loaded in the tape transport. The data compression apparatus divides each block of an incoming user data file into predetermined sized segments, each of which is compressed independently without reference to any other segment in the user data file. The data compression apparatus concurrently uses a plurality of data compression algorithms to adapt the data compression operation to the particular data stored in the user data file. A cyclic redundancy check circuit is used to compute a predetermined length CRC code from all of the incoming user data bytes before they are compressed. The computer CRC code is appended to the end of the compressed data block.

The data compression apparatus operates by converting bytes and strings of bytes into shorter bit string codes called reference values. The reference values replace the bytes and strings of bytes when recorded on the magnetic tape. The byte strings have two forms, a run length form for characters that are repeated three or more times, and a string form that recognizes character patterns of two or more characters. Two variables are used to indicate the maximum and minimum byte values in a particular segment. Single user data bytes are compressed by using reference values that are defined for the range of values delimited by the above mentioned variables for each segment. One variable called BEGIN contains the smallest user data byte value in the segment while the other variable END contains the largest user data byte value in the segment. Consecutive reference values are assigned to all byte values in the range starting with the byte value in the BEGIN variable through the byte value in the END variable. The reference value uses the minimum number of bits necessary to ensure a unique value assigned to each byte by suppressing the most significant consecutive bits of zero value not needed to distinguish this reference value from all others previously defined.

Strings of two or more bytes are compressed by assigning a reference value to each defined string using an adaptive data compression algorithm. Subsequent occurrences of that string are replaced by its string reference value. Strings are constructed a character at a time, where a previously defined string plus the next user data byte defines a new string and is assigned the next previously undefined reference value. Thus, strings become longer and data compression more efficient as more user data bytes in the segment are examined. However, as more strings are defined, greater length reference values are needed to uniquely identify a string, reducing the efficiency of the compression process. This factor makes it desirable to divide a data block into segments which are compressed independently. String definition occurs by combining the last used reference value with the next user data byte from the input data stream, then searching to see if this string has been previously defined. If it has, the next byte is concatenated to this new byte string reference value and a search is again conducted to see if this extended byte string has been previously defined as a string. This sequence is continued until a string is located that has not been previously defined. The last used defined string reference value is put in the compressed output data stream and the next previously undefined reference value is assigned to define the last string that was not found. The search procedure is initiated over again starting with the most recently used user data byte.

Runs of three or more repeated bytes are encoded using a predetermined set of reserved reference values to indicate that the preceding character was repeated the number of times specified by the repeat code. The immediately preceding character is not reincluded in the repeat count. Run length encoding takes precedence over string data compression. Run length encoding, single byte compression, and string data compression are intermixed in any compressed segment within the user data block.

If the size of a compressed segment in bytes is larger than its size before compression then the segment is not compressed and is recorded in uncompressed format. An uncompressed segment is identified by the BEGIN variable containing a value which is larger than the END variable.

Data Compression Apparatus Architecture

FIG. 1 illustrates the adaptive data compression apparatus in block diagram form. The data compression apparatus 100 receives user data from the host computer (not shown) via bus 111 during a data file write operation. Data compression apparatus 100 transforms the received user data into a new bit oriented compressed format. The compressed data is then transmitted over bus 112 to a tape drive control unit data buffer (not shown) for writing onto the magnetic tape. During a read operation, data compression apparatus 100 receives the compressed data from the tape drive control unit data buffer and decompresses this data. The decompressed data now represents the original user data as originally received from the host computer. This reconstituted user data is then transmitted over bus 111 to the control unit host interface. The start of the transfer of the user data to the control unit host interface can begin before the entire file has been decompressed. The circuitry contained in data compression apparatus 100 performs the above described character/string encoding/decoding and run length encoding/decoding.

Data compression apparatus 100 in this embodiment is described as residing within the tape drive control unit. The location of data compression apparatus 100 is between the control unit host interface (the circuit that transfers data to/from the host computer data channels) and the data buffer within the tape drive control unit. This data compression apparatus 100 can be located between the tape drive control unit and the tape transport, but this location makes it difficult to sustain a fixed device data transfer rate under conditions of varying data compression efficiency. In addition, the disclosed location of the data compression apparatus 100 allows the space in the data buffer in the tape drive control unit to be used more efficiently by storing compressed data therein.

Interconnection of the data compression apparatus 100 to the control unit host interface via bus 111 is accomplished through data transfer control interface 101. Interconnection of the data compression apparatus 100 to the tape drive control unit data buffer via bus 112 is accomplished by data buffer interface 102. These two interfaces 101, 102 serve to store data received via the associated buses 111, 112 for processing by the data compression apparatus 100. Interfaces 101, 102 when accomplishing this interconnect function, switchably interconnect various ones of signal leads 121-123, 125-127 with the buffers contained in the respective interface circuits 101, 102 that contain the data The channel data circuit 104 contains all of the logic, registers and memory devices needed to control the data flow for read and write operations to the data transfer control interface 101. The flow of data through the data compression apparatus 100 has seven different transfer modes. These modes are:

1. Data transfer control interface 101 to data buffer interface 102.
2. Channel data circuit 104 to compression circuit 105.
3. Channel data circuit 104 to data buffer interface 102.
4. Channel data circuit 104 to compression check circuit 107.
5. Decompression circuit 106 to compression check circuit 107.
6. Channel data circuit 104 to data transfer control interface 101.
7. Decompression circuit 106 to channel data circuit 104.

All data compression is performed in compression circuit 105. The compression circuit 105 operates only during a data write operation from the control unit host interface to the tape drive control unit data buffer. The algorithm used for data compression is a combination of run length encoding and a bit oriented coding format as described below.

The decompression circuit 106 decompresses (expands) the compressed data received by data buffer interface 102 from the associated tape drive control unit data buffer. All data decompression is performed by decompression circuit 106. Decompression circuit 106 is used both during a tape read and a tape write operation. During a tape read operation, the compressed data is received by the data buffer interface 102 from the associated tape drive control unit data buffer via bus 112. The compressed data is then decompressed in decompression circuit 106 and transmitted to channel data circuit 104. Channel data circuit 104 forwards the decompressed data to data transfer control interface 101 which forwards the data to the control unit host interface via bus 111. During a data write operation to the tape drive control unit data buffer, the compressed data is received by decompression circuit 106 from compression circuit 105 via the data buffer interface 102. This compressed data is then decompressed by decompression circuit 106 and compared with the original uncompressed user data that is still stored in the channel data circuit 104. This compression check operation insures that the compression function performs accurately.

Bypass circuit 103 functions to bypass the entire data compression/decompression apparatus. During a bypass operation, channel data circuit 104 enables bypass circuit 103 via lead 131 to directly transfer data between the data transfer control interface 101 and the data buffer interface 102.

Data Write Operation

Figure 2:
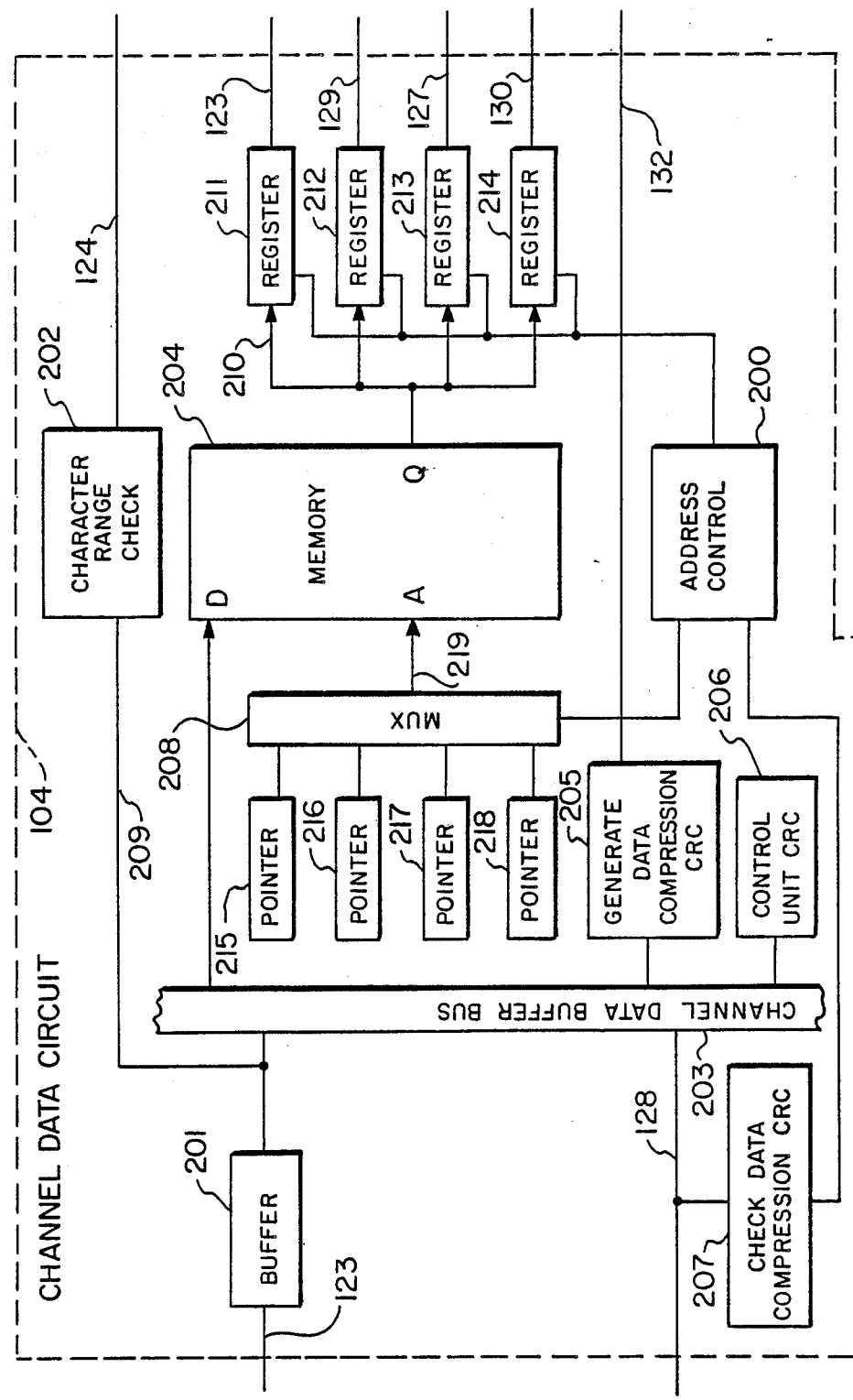
FIGS. 2-6 illustrate additional details of various segments of the apparatus included in the data compression apparatus.

In order to better illustrate the operation of the elements shown in FIG. 1, the processing of a data write operation is described herein. The uncompressed user data is transmitted from the control unit host interface via bus 111 to the data transfer control interface 101. The received user data is forwarded a segment at a time over lead 123 to buffer 201 of channel data circuit 104 as illustrated in FIG. 2. Buffer 201 is used to receive the user data file and accommodate timing variations in the transmitted data. The buffered segment of the user data is output from buffer 201 via lead 209 to both character range check circuit 202 and channel data buffer bus 203. The character range check circuit 202 determines the smallest and largest character byte values in each segment of the received user data. The character range check circuit 202 assigns the smallest value to the variable BEGIN and the largest value to the variable END. These calculated values are transmitted by character range check circuit 202 over lead 124 to compression circuit 105.

The received segment of the user data block is carried by channel data buffer bus 203 to a plurality of destinations. The segment of the user data block is stored in memory 204 while generate data compression CRC circuit 205 and control unit CRC circuit 206 perform their operations on the segment that appears in bytewise fashion on channel data buffer bus 203. The generate data compression CRC circuit 205 computes a cyclical redundancy check value for the entire user data block and the computed value is appended to the end of the data block that is compressed. In addition, control unit CRC circuit 206 generates a cyclic redundancy check value for the received user data block for comparison with the CRC value that has been computed by the control unit host interface within the control unit. This control unit CRC value is not written onto the tape. The comparison is performed by a microprocessor (not shown) in the tape drive control unit to insure that no errors have occurred in the transmission of the user data within the tape drive control unit.

Memory Pointers

The channel data circuit 104 illustrated in FIG. 2 also includes a plurality of pointers 215–218 to keep track of the data that is stored in memory 204. Write pointer 215 is an incrementer that points to the present address of data that is being written into memory 204. It is used to identify the location of data received from the control unit host interface during the data compression operation and the location of data that is input to memory 204 from decompression circuit 106 during a data decompression operation. Compressed data pointer 216 is an incrementer that points to the present address for reading data from memory 204 to the compression circuit 105. Not compressed data pointer 217 is an incrementer that points to the present address for reading data from memory 204 to the data buffer interface 102 when data is written over lead 127 to the tape drive control unit data buffer in an uncompressed form. Compression check pointer 218 is an incrementer that points to the present address for reading data from memory 204 to either verify that the data written on the tape is correct on a data compression operation or to transmit data to the data transfer control interface 101 on a data decompression operation. Compression check pointer 218 also contains a decrementer to read the data from memory 204 backwards if the data decompression operation is a read backwards operation.

Data Registers

Address control circuit 200 activates multiplexer 208 to switchably interconnect the output of one of pointers 215–218 with lead 219 to thereby apply the address generated by one of the pointers 215–218 to the address terminals of memory 204 to enable memory 204 to either store data applied to the D input terminal from channel data buffer bus 203 or to output data from memory 204 via the Q terminal to leads 210. Data that is read from memory 204 to leads 210 is applied to the plurality of registers 211–214 that are connected in parallel to bus 210. Register 211 is a data transfer control interface register that interconnects memory 204 with data transfer control interface 101 via leads 123. Compression register 212 interconnects memory 204 with compression circuit 105 via leads 129. Data buffer interface register 213 interconnects memory 204 with data buffer interface 102 via leads 127. Compression check register 214 interconnects memory 204 with compression check circuit 107 via leads 130. These registers 211–214 operate under control of address control circuit to switchably interconnect a segment of the user data block that has been stored in memory 204 with one of four possible destinations as were enumerated above.

Thus, the segments of a user data block are transmitted from the control unit host interface via bus 111 to data transfer control interface 101. The segments of the user data block are forwarded via lead 123 to channel data circuit 104 where they are stored intact in memory 204 while the character range is checked by character range check circuit 202 and the cyclical redundancy check variables are calculated by control unit CRC circuit 206 and data compression CRC circuit 205. Address control circuit 200 operates to direct this received user data that is stored in memory 204 to the proper destination based on the operations that are to be performed on this user data. Typically, the user data is transmitted from memory 204 to compression circuit 105 where the compression algorithm operates to compress this data and forward the compressed data to the tape drive control unit data buffer via data buffer interface 102. The use of this circuitry for data file read operations is discussed below.

Compression Circuit

Figure 3:
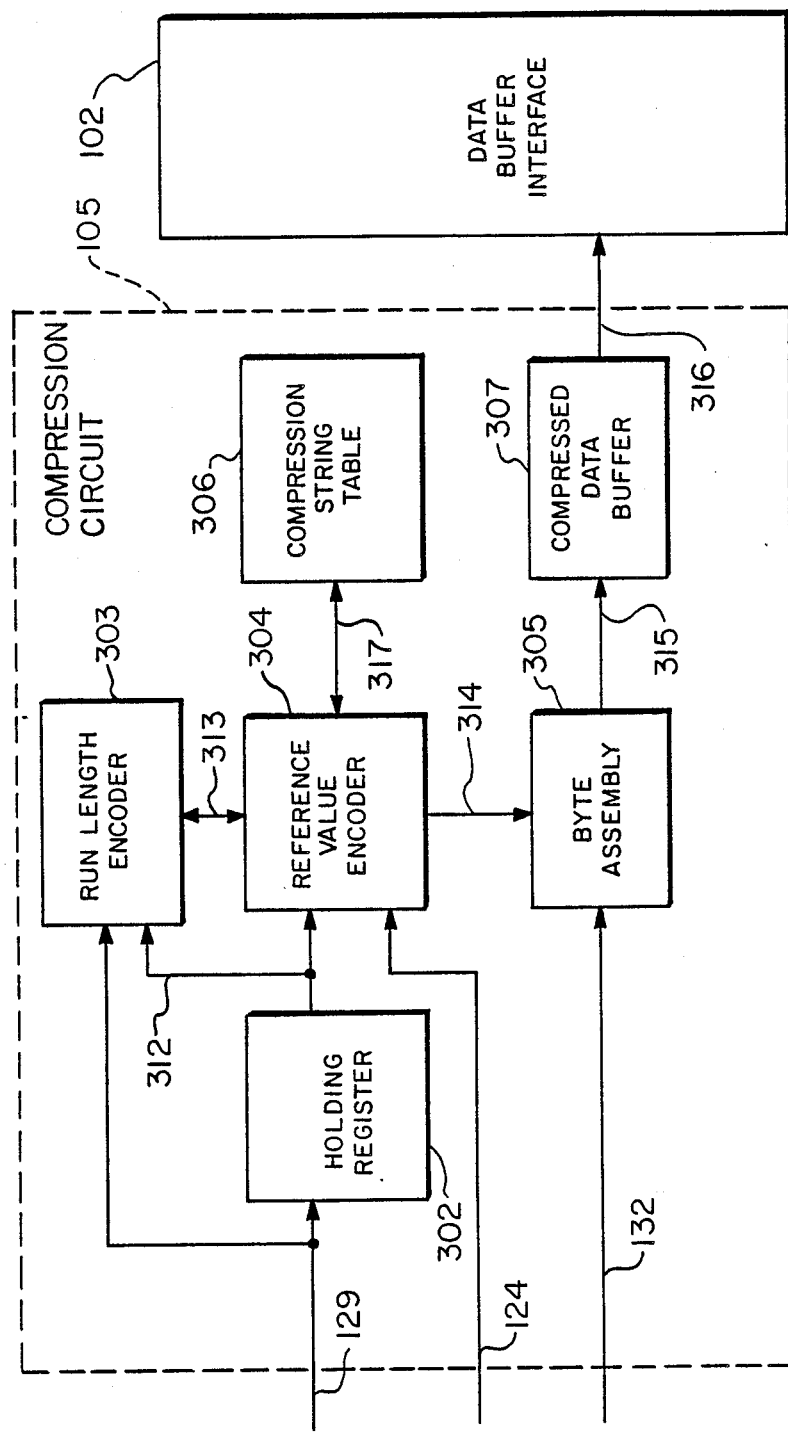

FIG. 3 illustrates in block diagram form the details of the compression circuit 105 of data compression apparatus 100. The compression of the user data file is performed in compression circuit 105 during a tape write operation. The algorithm used in compression circuit 105 for data compression is a combination of run length encoding and a bit oriented format.

Channel data circuit 104 transmits each segment of the user data file to compression circuit 105 over leads 129. This received data word is transmitted to holding register 302 via lead 129 which allows the run length encoder 303 to monitor three input bytes to detect a run length of three bytes or more. This is accomplished by run length encoder circuit 303 monitoring the data byte presently processed by reference value encoder 304 via lead 313, the subsequent byte temporarily stored in holding register 302 via lead 312 and a third subsequent byte on path 129. Thus, run length encoder circuit 303 monitors these three inputs to detect a run length of three or more bytes. When all of these inputs are the same, run length encoder circuit 303 transmits a run length detect signal to reference value encoder 304 via leads 313 which then encodes the last character it received and then transfers control to run length encoder circuit 303. Run length encoder circuit 303 begins the run length counter (not shown) contained therein and continues to compare the three inputs as subsequent data bytes are transmitted via lead 129 to compression block 105 by channel data circuit 104. Run length encoder 303 increments the run length counter each time an input data byte is input and found to be part of the run of identical data bytes. When the run of identical data bytes has ended, run length encoder 303 removes the run detect signal, thereby stopping the run length counter and encoding the value contained therein into a repeat code. This repeat code is output to reference value encoder 304 via leads 313, which inserts this code value into the compressed data stream.

Data bytes that are not part of a run length are encoded by reference value encoder 304 into a code value based on the lookup table stored in compression string table 306. As each data byte is compressed into a new bit format, it is transmitted to byte assembly circuit 305 via lead 314, which assembles the bit strings into bytes and generates a parity bit for this byte. The compressed data is then stored via lead 315 in the compressed data buffer 307 until it is output over lead 316 and via data buffer interface 102 to the tape drive control unit data buffer. Generate data compression CRC 205 is inserted into the compressed data stream in byte assembly 305 via lead 131.

If compression circuit 105 determines that the number of bytes output in the compressed segment is greater than the number of bytes in the original, uncompressed segment, then the bytes values of BEGIN and END are changed so that BEGIN is greater than END. The values of BEGIN and END are output from compressed data buffer 307 to data buffer interface 102 via lead 316. In addition, address control 200 in channel data circuit 104 enables not compressed data pointer 217 to address memory 204 to read the original, uncompressed segment on to leads 127 via leads 210 and data buffer interface register 213. The original, uncompressed segment is thereby transferred to data buffer interface 102 where it is then transmitted to the tape drive control unit data buffer.

Reference value Encode Circuit

Figure 4:
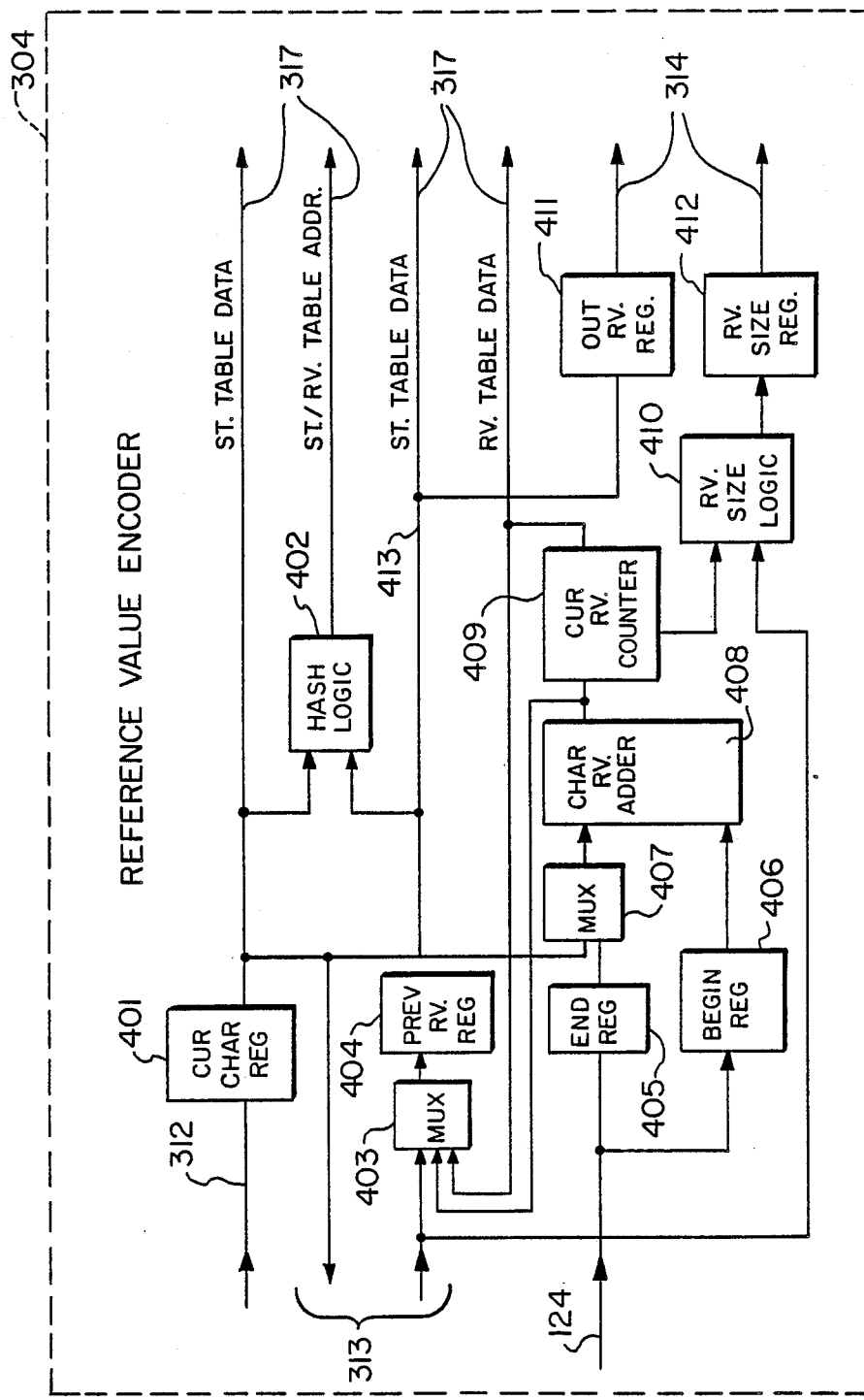

FIG. 4 illustrates in block diagram form the elements that comprise reference value encode circuit 304 that functions to replace single bytes of data and data byte strings with bit string codes called reference values that represent the data bytes and data byte strings using significantly fewer bits than the original uncompressed data. A data byte is input to reference value encoder circuit 304 from holding register 302 in compression circuit 105. This data byte is stored in current character register 401 for use in the compression process. In addition, channel data circuit 104 outputs the variables END and BEGIN from character range check circuit 202 over line 124. These variables are stored respectively in registers 405 and 406 to store the largest and smallest character code values in its particular segment of the user data. These variables are used to define the range of reference values which encode single user data bytes. Reference values in this range are known as character reference values. Reference values which are numerically greater than the character reference values encode strings of multiple bytes. These reference values are known as string reference values. Reducing the number of reference values reserved for encoding single user data bytes reduces the average number of bits required for each reference value in the compressed data stream.

The present data byte is output by current character register 401 to run length encoding circuit 303 as described above as well as to multiplexer 407. Multiplexer 407 applies either the variable END, as stored in register 405, or the present character value, from current character register 401, to one input of character reference value adder circuit 408. Another input to character reference value adder circuit 408 is the variable BEGIN as stored in register 406. Character reference value adder circuit 408 is used to calculate the initial multiple data byte string reference value in a segment and to calculate character reference values.

The character reference value is output by character reference value adder 408 to multiplexer 403 and to current reference value counter circuit 409. The current reference value counter circuit 409 contains the reference value for subsequently defined strings. This counter is incremented every time a new string is defined. The counter is initially loaded with the first reference value designated for encoding strings. The current reference value counter 409 outputs the present reference value to reference value size logic circuit 410 which encodes this value into a four bit variable that provides the number of bits needed to encode the largest reference value defined so far. During run length encoding, the reference value size logic circuit 410 uses the run length reference value obtained from run length encoder circuit 303 to encode the number of bits needed to define the repeat count code. The variable output by reference value size logic circuit 410 is temporarily stored in register 412 before being transmitted to byte assembly circuit 305 which uses this information to assemble the reference values into blocks of sixteen bits.

Previous reference value register 404 contains the last string reference value generated by compression block 105. There are three different types of reference values that can be stored in previous reference value register 404 depending on which input is switched by multiplexer 403 to the register 404. The three inputs to multiplexer 403 are: run length reference value received from run length encoder 303, a character reference value output by character reference value adder circuit 408, or a reference value obtained from compression string table 306. During normal operations, previous reference value register 404 contains the reference value of the last string that was located in the compression string table 306. However, if the compression string table 306 could not define a string, then the previous reference value register 404 contains the character reference value of the current character. During a run length encoding process, the previous reference value register 404 is used to output the run length reference value and the repeat count code as received from the run length encoding circuit 303. Previous reference value register 404 outputs a value to output reference value register 411 which forwards this data to byte assembly circuit 305 only during run length encoding and when a new string or character reference value is encoded.

The encoding process is accomplished by the use of hash logic circuit 402 which codes the value contained in current character register 401 and previous reference value register 404 into an input address for the compression string table 306. This resultant address is used to address compression string table 306 to produce a reference value. The value stored in current character register 401 and the value stored in previous reference value register 404 is compared with the string definitions for all of the strings built by reference value encode block 304 for this particular segment of the user data file. The string reference value definitions are addressed by a hash of the combination of the previous reference value and the current character and are output on lead 413 to previous reference value register 404 and output reference value register 411 if a comparison is found in the string table. Thus, the reference value calculated by reference value encode circuit 304 is output to byte assembly circuit 305 where reference values are combined into bytes which are then stored in the compressed data buffer 307 for transmission to the tape drive control unit data buffer.

Data Compression Algorithm

Data compression is accomplished by transforming the user data block that is transmitted to data compression circuit 100 by the host computer into a bit oriented compressed format. The compressed data block is recorded in the user bytes of a recorded data block on tape.

The user data bytes in each recorded user data block are divided into n segments, wherein each segment is of a predetermined equal size. The data compression algorithm processes one segment at a time to compress the data contained therein. The last segment is the residual segment and contains any residual user data bytes. A two byte cyclical redundancy check value is appended to the compressed data block following the residual segment. Each segment other than the residual segment contains the same amount of data as all the other segments in the data file before compression. The amount of compressed data recorded on the magnetic tape per segment is typically much less than the original amount of data contained in the segment, depending on the effectiveness of the compression algorithm on this particular user data. Each segment is compressed independently without reference to any other segment. The data compression is accomplished by converting bytes and strings of bytes into shorter bit string codes called reference values. The reference values replace the bytes and strings of bytes when recorded on tape. The byte strings have two forms, a run length form for characters that are repeated three or more times and a string form that recognizes character patterns of one or more characters. Single user data bytes are compressed by using reference values that are defined for the range of values delimited by the variables BEGIN and END in each block. The BEGIN field contains the smallest user data byte value in this particular segment. The END field contains the largest user data byte value in the segment. Consecutive reference values are assigned to all byte values in the range starting with the byte value in the BEGIN field through the byte value in the END field.

String Compression

Strings of bytes are compressed by using an adaptive data compression algorithm which assigns a reference value to each defined string. Subsequent occurrences of that string are replaced by its string reference value. These strings are built a character at a time, that is a previously defined string plus the next user data byte shall define a new string and is assigned the next previously undefined reference value. Thus, strings become longer and data compression more efficient as more user data bytes in the segment are examined. In operation, string definition occurs by combining the last used reference value with the next user data byte from the input data stream. This resultant string is then used to search the string table to determine whether this string has previously been defined. If it has, the next subsequent data byte is concatenated to the reference value of the string which has just been found to form a new string table search pattern. The search is repeated to see if this extended byte string has been previously defined as a string. This process is iteratively continued until a string is found that has not been previously defined. Once this occurs, the last used defined string reference value is placed in the output compressed data stream and the next consecutive unused reference value is assigned to this undefined string. The search procedure is then initiated starting with the most recently received user data byte. Adaptive data compression algorithms are well known and the exact details of the present algorithm are not relevant for an understanding of the present apparatus. Therefore, the adaptive data compression algorithm is not disclosed in any further detail herein.

Runs of three or more repeated bytes are encoded by appending a repeat code to a reference value. This repeat code specifies the number of times that the last or only character of the string should be repeated. The compression algorithm therefore encodes the received byte and the run length encoding circuit maintains a count of how many of these encoded bytes are repeated sequentially in the string of received user data.

Several reference values are used and defined so that the number of bits in the repeat count field of the compressed data stream is reduced. Each run length reference value defines a range of repeat counts such that only the least significant bits of the repeat count need be written. Table A shows one example of a series of reference values which would be used if the compression segment size were 2048 bytes.

TABLE A

| Run Length Repeat Count Specification | | | |
|---|---|---|---|
| reference value | repeat code | # of bits in repeat count | byte repeat count |
| 1 | 0-1 | 1 | 2-3 |
| 2 | 0-3 | 2 | 4-7 |
| 3 | 0-7 | 3 | 8-15 |
| 4 | 0-F | 4 | 16-31 |
| 5 | 0-1F | 5 | 32-63 |
| 6 | 0-3F | 6 | 64-127 |
| 7 | 0-7F | 7 | 128-255 |
| 8 | 0-FF | 8 | 256-511 |
| 9 | 0-1FF | 9 | 512-1023 |
| 10 | 0-3FF | 10 | 1024-2047 |

Note:
The repeat code is expressed in hexadecimal form.

Data Record Read Operation

Figure 5:
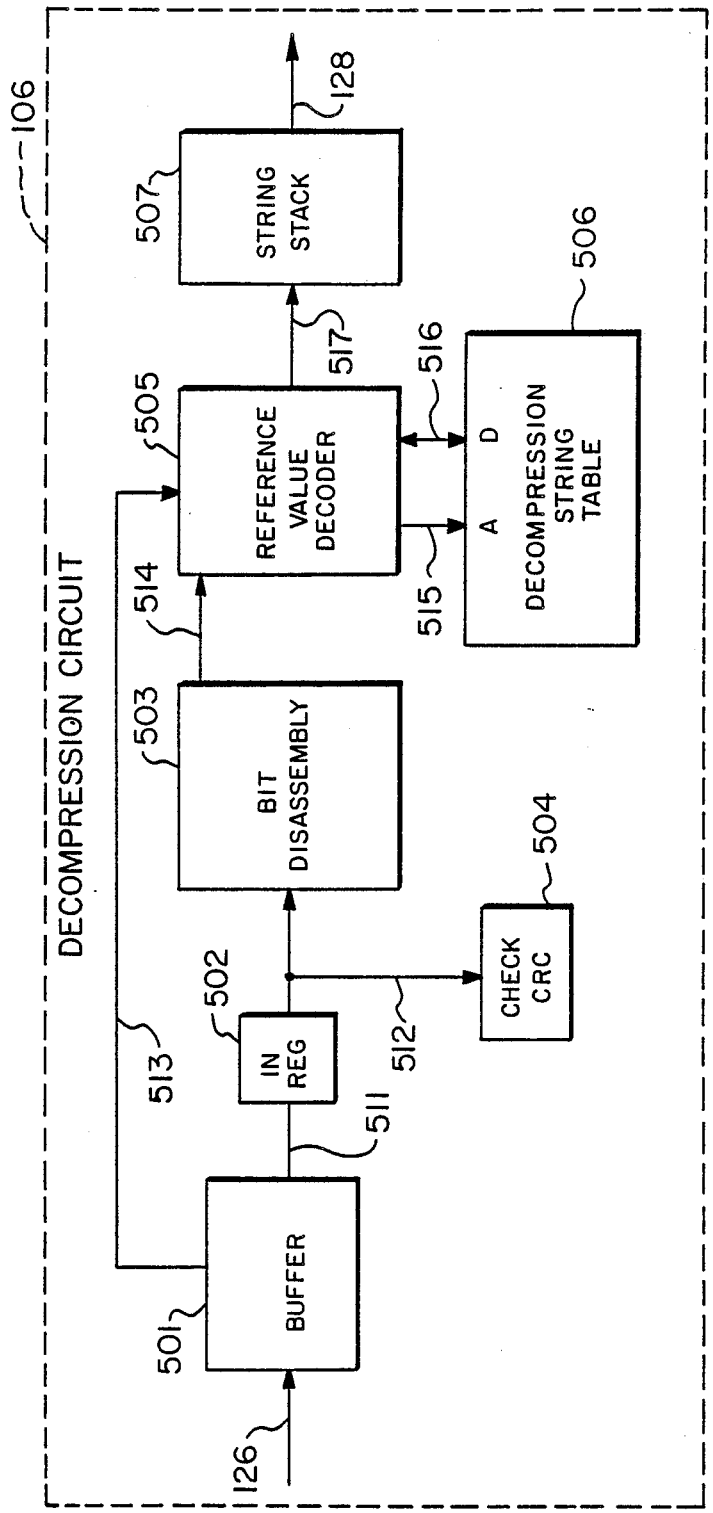
Figure 6:
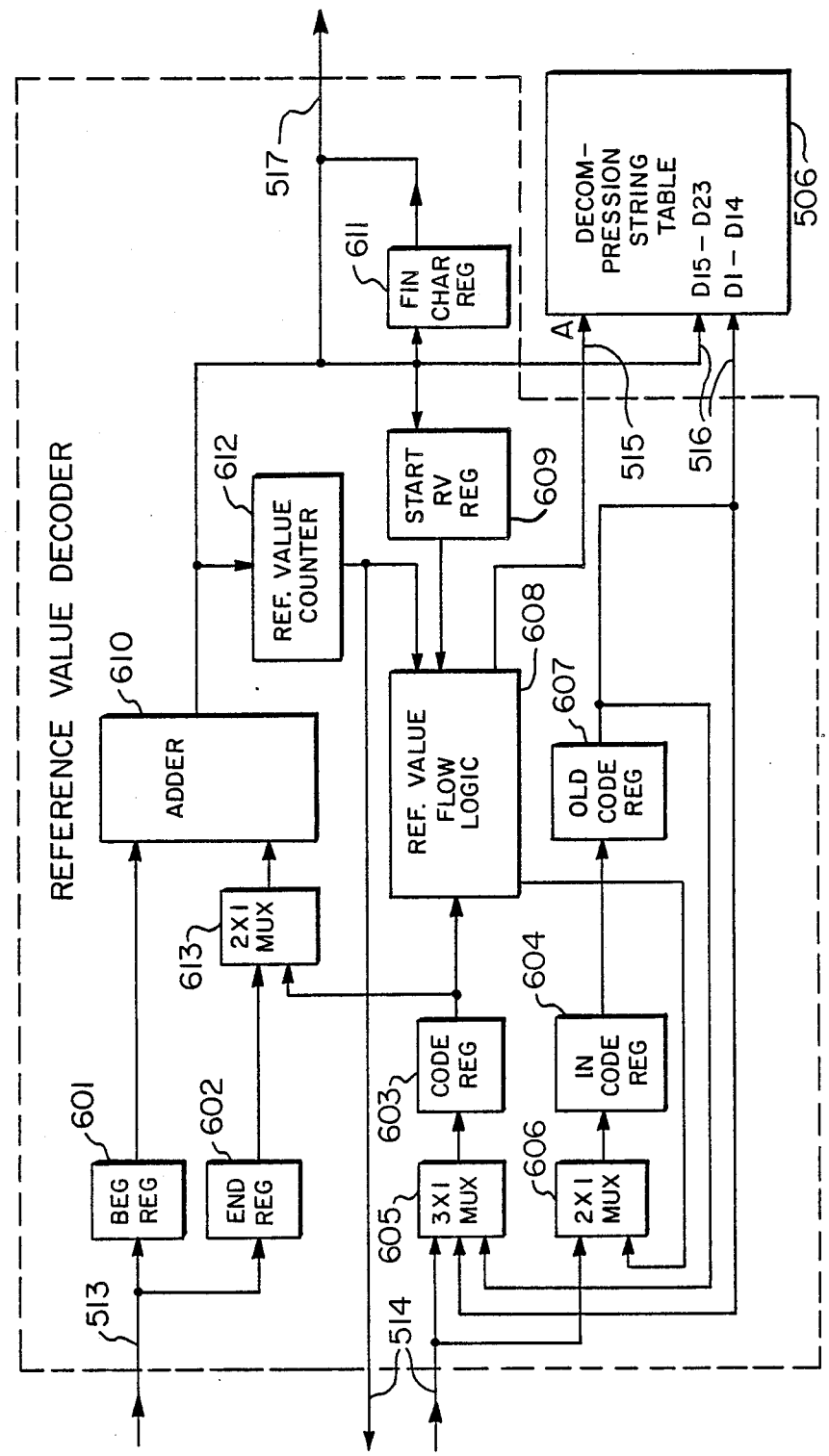

When a compressed data record is to be read from the tape, a decompression operation takes place to convert the compressed data file as stored on tape into the original uncompressed user data file. This is accomplished by data compression circuit 100 reading the compressed data file one segment at a time from the tape into decompression circuit 106 where it is stored in buffer 501 (shown on FIG. 5). The byte values of BEGIN and END are read to determine whether this segment is compressed before initiating the decompression operation. If this is a compressed segment, the compressed data bytes are then read on a single byte basis from buffer 501 into holding register 502 where they are used by CRC check circuit 504 to calculate a cyclical redundancy check for this particular segment. The stored data byte is also applied to bit disassembly circuit 503 which separates the input data bytes into individual reference values. Each reference value is checked for run length reference values by the run length detection logic contained in bit disassembly circuit 503. If no run length is detected, bit disassembly circuit 503 transmits the reference value to reference value decoder circuit 505.

Reference value Decoder Circuit

Reference value decoder circuit 505 replaces character reference values with original data bytes and string reference values with original byte strings. Thus, reference value decoder circuit 505 with its associated decompression string table 506 perform the inverse function of the reference value encoder and compression string table contained in compression circuit 105.

The reference value decoder circuit 505 includes two registers 601, 602 that hold respectively the smallest character code value BEGIN and largest character code value END in the block. These values are obtained from buffer 501 and are used to detect reference values which encode single bytes and to generate the characters thus encoded. Code register 603 contains the reference value that is presently being decoded. The input to code register 603 is from a multiplexer 605 with the initial reference value to decode being selected from the output of bit disassembly circuit 503. During the decode process, code register 603 can be loaded from two other sources. If the reference value has not yet been defined in the decompression string table 506, the code register 603 is loaded from the old code register 607. If the reference value is a string reference value, the code register 603 is loaded from the decompression string table 506. The incode register 604 contains the last reference value that was input to reference value decoder circuit 505 from bit disassembly circuit 503. The input to incode register 604 is controlled by a multiplexer 606 which selects either the reference value input from the bit disassembly circuit 503 or a predefined reference value obtained from reference value flow logic 608. The old code register 607 contains the last reference value which was fully decoded by decompression block 106. The start reference value register 609 contains the value of the first string reference value in the segment. The start reference value register 609 is loaded at the beginning of each segment by the adder circuit 610. The value stored herein is used by the reference value flow logic 608 to distinguish string reference values from character reference values. The final character register 611 contains the final character of a decoded reference value whether it is a string or a character reference value. If a character reference value is being encoded, the input to the final character register 611 comes from the adder 610. If a string reference value is being decoded, the input to the final character register 611 comes from decompression string table 506. The output of the final character register 611 goes to the string stack circuit 507 over lead 517. The reference value counter 612 contains the value of the largest string reference value decoded so far in this segment. The reference value counter 612 is first loaded with the first string reference value in the segment from the adder circuit 610. The reference value counter 612 is then incremented by the reference value flow logic 608 every time a new string is defined and stored in decompression string table 506. The reference value counter 612 is used by the reference value flow logic 608 to determine if the input reference value is not defined in the decompression string table 506 and by the bit disassembly circuit 503 to calculate the reference value size and to address the decompression string table 506 while rebuilding the decompression string table.

The adder circuit 610 is used to decode characters using character reference values and to calculate the beginning string reference value. The decompression string table 506 is in memory that contains the decode table of string definitions for this segment. The decompression string table 506 is built equivalent to the same table that compressed the segment. The definitions stored in the decompression string table 506 are referenced by using the coded reference value and when a string is found, the final character of the string is placed in the string stack 507.

String Stack

The String Stack stacks bytes from each string as the string is decompressed. As each byte is taken from the string it is put on the String Stack. When the string is fully decompressed and the last byte is taken from a string the bytes are popped from the stack to send them in the correct order to the Channel Data Block.

Tape Write Decompression-Compression Check

Decompression block 106 is also used during tape write operation. During a tape write operation, the compressed data is transmitted by the compression circuit 105 to the data buffer interface circuit 102 where it is transmitted both to the tape drive control unit data buffer and to the decompression circuit 106. This compressed data is decompressed in decompression circuit 106 and then compared to the original uncompressed data in the channel data circuit 104. This is accomplished by transmitting the decompressed data on lead 128 and the original uncompressed data in channel data circuit 104 to the compression check circuit 107 over lead 130. Address control 200 enables compression check pointer 218 and multiplexer 208 to address a location in memory 204 wherein the original, uncompressed data is stored. This original data file is then transmitted from memory 204 via bus 210 and buffer 214 to compression check circuit 107 where it is compared with the data that was compressed and then decompressed. If the compressed/decompressed data matches the original user data that was received from the host computer, then the compression operation was accurately performed. If there is a mismatch between the two segments of data, then the compression operation was flawed and the compression operation is repeated and the newly compressed data block is overwritten over the original compressed data block that was generated. In this fashion, the accuracy of the compression operation is immediately determined when the compressed data is written into the tape drive control unit data buffer.

Read Backwards

A special function of tape drive units is the ability to read files in the backwards direction. In order to do this, data compression circuit 100 has a buffer 501 which stores a full segment of data. Once the bytes which make up a compressed segment have been stored in buffer 501, the bytes are read from the buffer 501 in reverse of the order in which they were placed into the buffer 501. In order to reverse the bytes of a segment, it must be possible for buffer 501 to identify the location of the beginning of a segment when the segment is received last byte first. This is made possible by compression circuit 105 appending to each segment a value which identifies the length of the compressed or uncompressed representation of the segment. This segment length value arrives at buffer 501 before the bytes of the segment itself, allowing buffer 501 to identify the start of the segment. Thus, as the compressed data is read backwards into the adaptive data compression apparatus, the buffer 501 can divide the data into segments and begin the decompression process on a segment by segment basis before the entire compressed data file is read.

Since the read backwards function requires the data to appear in the backwards direction at the control unit host interface, the data must be reversed again when read from memory 204 on its way to the control unit host interface.

So as not to slow the throughput of data through buffer 501, double buffering is used. That is, while a segment is read out in backwards mode the next segment is written in to buffer 501.

While a specific embodiment of the present invention has been disclosed, it is expected that those skilled in the art can and will devise alternate embodiments that fall within the scope of the appended claims.

I claim:

1. A data compression apparatus for efficiently compressing a user block data into a bit compressed data block for storage on a data storage medium comprising:
means for dividing said user data block into a plurality of equal sized segments of data;
means for compressing each of said segments of data independent of all other segments of data in said user data block comprising:
means responsive to a received user data byte in one of said segments of data for determining whether said received user data byte is identical to the n previous data bytes, the last byte of a string or a single user data byte in said one segment of data;
means responsive to said determining means for assigning one of a plurality of run length reference values to a user data byte that is identical to at least the n previous user data bytes, where n is an integer >2;
means responsive to said determining means for assigning one of a plurality of byte compression reference values to a user data byte;
means responsive to said determining means for assigning one of a plurality of string compression reference values to a user data byte that comprises the last byte of a data string; and
means for writing each of said reference values successively received from said compressing means on to a data storage medium to form said bit compressed data block.

2. The apparatus of claim 1 further including:
means responsive to the last user data byte of said user data block for appending a CRC value representative of the CRC of said user data block to said bit compressed data block written on said data storage medium.

3. The apparatus of claim 1 further including:
means for storing each received data byte;
means responsive to said storing means storing the last byte of said one segment of data for calculating the byte length of said reference values written on to said data storage medium representative of said one segment of data; and
means responsive to said byte length exceeding the byte length of said one segment of data for writing said one segment of data on to said data storage medium in place of said reference values written on to said data storage medium representative of said one segment of data.

4. The apparatus of claim 1 further including:
means responsive to said compressing means assigning a reference value to the last data byte of said one segment of data for decompressing said reference values successively assigned to the data bytes of said one segment of data; and
means responsive to said decompressing means for comparing said decompressed bit compressed segment of said data block with said one segment of data to identify errors in said bit compressed segment of said data block.

5. The apparatus of claim 1 further comprising:
means for selectively bypassing said compressing means to write said segments of data directly on to said data storage medium.

6. The apparatus of claim 1 wherein said string reference value assignment means includes:
means for comparing a received string of data bytes with a table containing entries representative of previously received strings of data bytes in said one segment of data that have been assigned a string reference value; and
means responsive to said received string of data bytes failing to match said table entries for assigning a previously unassigned string reference value to said received string.

7. The apparatus of claim 1 further including:
means for determining the length of each compressed segment of data; and
means for appending a value, indicative of said determined length, to said compressed segment of data.

8. The apparatus of claim 7 further including:
means, responsive to said compressed data block read from said data storage medium in backwards order, for reading said appended value;
means for dividing a segment, the length of which is indicated by said appended value, from said read compressed data block; and
means for decompressing said divided segment.

9. A data compression apparatus for efficiently compressing a user data block into a bit compressed data block for storage on a data storage medium comprising:
means for dividing said user data block into a plurality of equal sized segments of data;
means for compressing each of said segments of data independent of all other segments of data in said user data file comprising:
means responsive to a received user data byte in one of said segments of data for determining whether said received user data byte is identical to the n previous data bytes, the last byte of a string or a single user data byte in said one segment of data;
means responsive to said determining means for assigning one of a plurality of run length reference values to a user data byte that is identical to at least the n previous user data bytes, where n is an integer >2;
means responsive to said determining means for assigning one of a plurality of byte compression reference values to a user data byte;
means responsive to said determining means for assigning one of a plurality of string compression reference values to a suer data byte that comprises the last byte of a data string;
means for writing each of said reference values successively received from said compressing means on to a data storage medium;
means for storing each received data byte;
means responsive to said storing means storing the last byte of said one segment of data for calculating the byte length of said reference values written on to said data storage medium representative of said one segment of data; and
means responsive to said byte length exceeding the byte length of said one segment of data for writing said one segment of data in place of said reference values written on to said data storage medium.

10. A method of efficiently compressing a user data block into a bit compressed data block for storage on a data storage medium comprising the steps of:
dividing said user data block into a plurality of equal sized segments of data;
compressing each of said segments of data independent of all other segments of data in said user data block comprising:
determining whether said received user data byte in one of said segments of data is identical to the n previous data bytes, the last byte of a string or a single user data byte in said one segment of data;
assigning one of a plurality of run length reference values to a user data byte that is identical to at least the n previous user data bytes, where n is an integer >2;
assigning one of a plurality of byte compression reference values to a user data byte;
assigning one of a plurality of string compression reference values to a user data byte that comprises the last byte of a data string; and
writing each of said reference values successively received from said compressing means on to a data storage medium.

11. The method of claim 10 further including the step of:
appending, in response to the last user data byte of said user block data, a CRC value representative of the CRC of said user data block to said bit compressed data block written on to said data storage medium.

12. The method of claim 10 further including the steps of:
storing each received data byte;
calculating the byte length of said reference values written on to said data storage medium representative of said one segment of data; and
writing, in response to said byte length exceeding the byte length of said one segment of data, said one segment of data on to said data storage medium in place of said reference values written on to said data storage medium.

13. The method of claim 10 further including the steps of:
decompressing, in response to said compressing means assigning a reference value to the last data byte of said one segment of data, said reference values successively assigned to the data bytes of said one segment of data; and
comparing said decompressed bit compressed segment of said data block with said one segment of data to identify errors in said bit compressed segment of said data block.

14. The method of claim 10 wherein the step of assigning a string reference value includes:
comparing a received string of data bytes with a table containing entries representative of previously received strings of data bytes that have been assigned a string reference value; and
assigning, in response to said received string of data bytes failing to match said table entries, a previously unassigned string reference value to said received string.

15. The method of claim 10 further including the steps of:
determining the length of each compressed segment of data; and
appending a value, indicative of said determined length, to said compressed segment of data.

16. The method of claim 15 further including the steps of:
reading said appended value from said compressed data block when said compressed data block is read from said data storage medium in backwards order;
dividing a segment, the length of which is indicated by said appended value, from said compressed data block; and
decompressing said divided segment.

17. A method of efficiently compressing a user data block into a bit compressed data block for storage on a data storage medium comprising the steps of:

dividing said user data block into a plurality of equal sized segments of data;

compressing each of said segments of data independent of all other segments of data in said user data block comprising:

determining in response to a received user data byte in one of said segments of data whether said received user data byte is identical to the n previous data bytes; the last byte of a string or a single user data byte in said one segment of data;

assigning one of a plurality of run length reference values to a user data byte that is identical to at least the n previous user data bytes, where n is an integer >2;

assigning one of a plurality of byte compression reference values to a user data byte;

assigning one of a plurality of string compression reference values to a user data byte that comprises the last byte of a data string;

writing each of said reference values successively received from said compressing means on to a data storage medium;

storing each received data byte;

calculating, in response to said storing means storing the last byte of said one segment of data, the byte length of said reference values written on to said data storage medium representative of said one segment of data; and writing, in response to said byte length exceeding the byte length of said one segment of data, said one segment of data in place of said reference values written on to said data storage medium.

* * * * *